United States Patent
Lin et al.

(10) Patent No.: US 6,934,866 B2
(45) Date of Patent: Aug. 23, 2005

(54) NETWORK INTERFACE USING PROGRAMMABLE DELAY AND FREQUENCY DOUBLER

(75) Inventors: Jonathan Lin, Fremont, CA (US); Yong Jiang, Fremont, CA (US)

(73) Assignee: Broadcom Corporaton, Irvine, CA (US)

(*) Notice: Subject to any disclaimer, the term of this patent is extended or adjusted under 35 U.S.C. 154(b) by 577 days.

(21) Appl. No.: 10/098,337

(22) Filed: Mar. 18, 2002

(65) Prior Publication Data

US 2002/0131456 A1 Sep. 19, 2002

Related U.S. Application Data

(60) Provisional application No. 60/276,034, filed on Mar. 16, 2001.

(51) Int. Cl.[7] .................................................. G06F 1/12
(52) U.S. Cl. ........................................................ 713/401
(58) Field of Search .................................. 713/400, 401

(56) References Cited

U.S. PATENT DOCUMENTS

| | | | | |
|---|---|---|---|---|
| 5,923,621 A | * | 7/1999 | Kanekal et al. | 368/117 |
| 6,385,710 B1 | * | 5/2002 | Goldman et al. | 711/169 |
| 6,437,619 B2 | * | 8/2002 | Okuda et al. | 327/158 |
| 2001/0017558 A1 | * | 8/2001 | Hanzawa et al. | 327/165 |
| 2001/0045853 A1 | * | 11/2001 | Saeki | 327/233 |

\* cited by examiner

Primary Examiner—John R. Cottingham
(74) Attorney, Agent, or Firm—Squire, Sanders & Dempsey, L.L.P.

(57) ABSTRACT

A network device includes an input, at least one port, a frequency doubler, a data I/O device, and a variable delay circuit. The input is for receiving an external clock signal. The frequency doubler is coupled to the input and configured to receive an input signal and output an output signal with a frequency double that of the input signal. The data I/O device is configured to output data to the at least one port based on a reference clock signal. The variable delay circuit is located between the data I/O device and at least one port. An external clock signal received at the input is input into the frequency doubler. The output signal of the frequency doubler is applied to the data I/O device as the reference clock signal, and the output data is delayed by the variable delay circuit.

39 Claims, 10 Drawing Sheets

NETWORK INTERFACE USING PROGRAMMABLE DELAY AND FREQUENCY DOUBLER

REFERENCE TO RELATED APPLICATIONS

This application claims priority of U.S. Provisional Patent Application Ser. No. 60/276,034 entitled "2.5 G Bit Ethernet interface design with programmable delay element and frequency doubler," filed on Mar. 16, 2001, the contents of which are hereby incorporated by reference.

BACKGROUND OF THE INVENTION

1. Field of the Invention

The invention relates to systems and methods for transmitting data between network devices. In particular, the invention relates to systems and methods for linking network devices at high speeds using double the data rate (DDR).

2. Description of the Related Art

As computer performance has increased in recent years, the demands on computer networks has also increased; faster computer processors and higher memory capabilities need networks with high bandwidth capabilities to enable high speed transfer of significant amounts of data. The well-known Ethernet technology, which is based upon numerous IEEE Ethernet standards, is one example of computer networking technology which has been able to be modified and improved to remain a viable computing technology. A more complete discussion of prior art networking systems can be found, for example, in SWITCHED AND FAST ETHERNET, by Breyer and Riley (Ziff-Davis, 1996), and numerous IEEE publications relating to IEEE 802 standards. Based upon the Open Systems Interconnect (OSI) 7-layer reference model, network capabilities have grown through the development of repeaters, bridges, routers, and, more recently, "switches", which operate with various types of communication media. Thickwire, thinwire, twisted pair, and optical fiber are examples of media which has been used for computer networks. Switches, as they relate to computer networking and to ethernet, are hardware-based devices which control the flow of data packets or cells based upon destination address information which is available in each packet. A properly designed and implemented switch should be capable of receiving a packet and switching the packet to an appropriate output port at what is referred to wirespeed or linespeed, which is the maximum speed capability of the particular network. Current basic Ethernet wirespeeds typically range from 10 Megabits per second (Mps) up to 10,000 Mps, or 10 Gigabits per second. As speed has increased, design constraints and design requirements have become more and more complex with respect to following appropriate design and protocol rules and providing a low cost, commercially viable solution.

Competition and other market pressures require the production of more capable network devices that cost less. Increased network and device speed is required by customers. In order to support high performance network solutions, new and improved systems and methods are needed for linking network devices, such as linking high performance switches with one another.

One system or method of improving linking performance includes increasing the speed of the external clock or of the board clock speed. Faster clock speed means faster data speeds. However, faster and more reliable clocks are more expensive and are therefore not preferred by manufacturers. Furthermore, devices are often constructed on printed circuit boards (PCB), which are manufactured to within certain tolerances. On-board clock speeds for PCBs are often limited by manufacturing tolerances, and mass produced PCB's may not be able to handle the same clock cycle rates as silicon chips. Increasing the quality of a PCB to handle faster clock speeds decreases manufacturing yield, and can also be very expensive. Therefore, new and improved systems and methods are needed for increasing linking speeds between network devices without increasing the speed external clocks or changing the design of the PCB. Such systems and methods should also take into account variations in chip material speeds due to process or operating conditions.

SUMMARY OF THE INVENTION

According to an embodiment of the present invention, a network device is provided which includes an input, at least one port, a frequency doubler, a data I/O device, and a variable delay circuit. The input is for receiving an external clock signal. The frequency doubler is coupled to the input and configured to receive an input signal and output an output signal with a frequency double that of the input signal. The data I/O device is configured to output data to the at least one port based on a reference clock signal. The variable delay circuit is located between the data I/O device and at least one port. An external clock signal received at the input is input into the frequency doubler. The output signal of the frequency doubler is applied to the data I/O device as the reference clock signal, and the output data is delayed by the variable delay circuit.

According to another embodiment of the present invention, a network device is provided which includes an input means, at least one port, a frequency doubler means, a data I/O means, and a variable delay circuit means. The input means is for receiving an external clock signal. The frequency doubler means is coupled to the input for receiving an input signal and outputting an output signal having a frequency double that of the input signal. The data I/O means is for outputting data to the at least one port based on a reference clock signal. An external clock signal received at the input means is input into the frequency doubler means. The output signal of the frequency doubler means is applied to the data I/O device as the reference clock signal. The output data is delayed by the variable delay circuit means.

According to another embodiment of the present invention, a method is provided for linking network devices including a step of receiving an external clock signal at a first device. Next, the external clock signal received by the first device is split into a first input clock signal and a second input clock signal within the first device. Next, the frequency of the first input clock signal is doubled. The doubled clock signal is applied to data to be outputted of the first device at double the data rate of the external clock signal, the data being outputted at a port of the first device. The data to be outputted is delayed. The second input clock signal is provided to the port of the first device. The data is variably delayed to synchronize the data with the second input clock signal, and the data and the second input clock signal are transmitted out of the first device at the port.

According to another embodiment of the present invention, a network device is provided which includes a first switch and a second switch. The first switch includes an input, a first plurality of ports, a frequency doubler coupled to the input and configured to receive an input signal and output an output signal with a frequency double that of the input signal, an I/O device configured to output data to at least one of the plurality of ports based on a first reference clock signal, and a variable delay circuit. The second switch includes a second plurality of ports and a double data rate receiving unit configured to receive data and a second reference clock signal from at least one of the second plurality of ports, and to extract data based on a rising edge and a falling edge of the second reference clock signal. The device also includes an external clock couple to the first switch. A circuit is provided coupling a first link port of the first plurality of ports to a second link port of the second plurality of ports. An external clock signal received as the input of the first switch from the external clock is input into the frequency doubler. The output of the frequency doubler is input to the I/O device as a first reference clock signal. The I/O device outputs the data to the first link port via the variable delay circuit. The variable delay circuit delays the data. The switch is configured to output the data and the external clock signal from the link port to the second link port of the second switch via the circuit. The second switch is configured to receive the data and the external clock signal and input the external clock signal as a second reference clock and the data to the double data rate receiving unit. The double data rate receives unit the data.

According to another embodiment of the present invention, a network device which includes a first switch means, a second switch means, an external clock means, and a circuit means The first switch means includes an input mean, a first plurality of ports, a frequency doubler means coupled to the input for receiving an input signal and outputting an output signal with a frequency double that of the input signal, an I/O device means for outputting data to at least one of the plurality of ports based on a first reference clock signal, and a variable delay circuit means. The second switch means includes a second plurality of ports and a double data rate receiving means for receiving data and a second reference clock signal from at least one of the second plurality of ports, and for extracting data based on a rising edge and a falling edge of the second reference clock signal. The external clock means is for generating an external clock signal coupled to the first switch. The circuit means is for coupling a first link port of the first plurality of ports to a second link port of the second plurality of ports. The first switch means is configured to receive an external clock signal via the input means from the external clock means and input the external clock signal into the frequency doubler means, to input the output of the frequency doubler means to the I/O device means as a first reference clock signal, to output the data from the I/O device means to the first link port via the variable delay circuit means, the data being delayed by the variable delay circuit means, and to output the data and the external clock signal from the link port to the second link port via the circuit means. The second switch is configured to receive the data and the external clock signal and input the external clock signal as a second reference clock, and the data to the double data rate receiving means. The double data rate receiving unit is configured to extract the data at double data rate.

BRIEF DESCRIPTION OF THE DRAWINGS

The objects and features of the invention will be more readily understood with reference to the following description and the attached drawings, wherein.

DETAILED DESCRIPTION OF THE PREFERRED EMBODIMENTS

Figure 1:
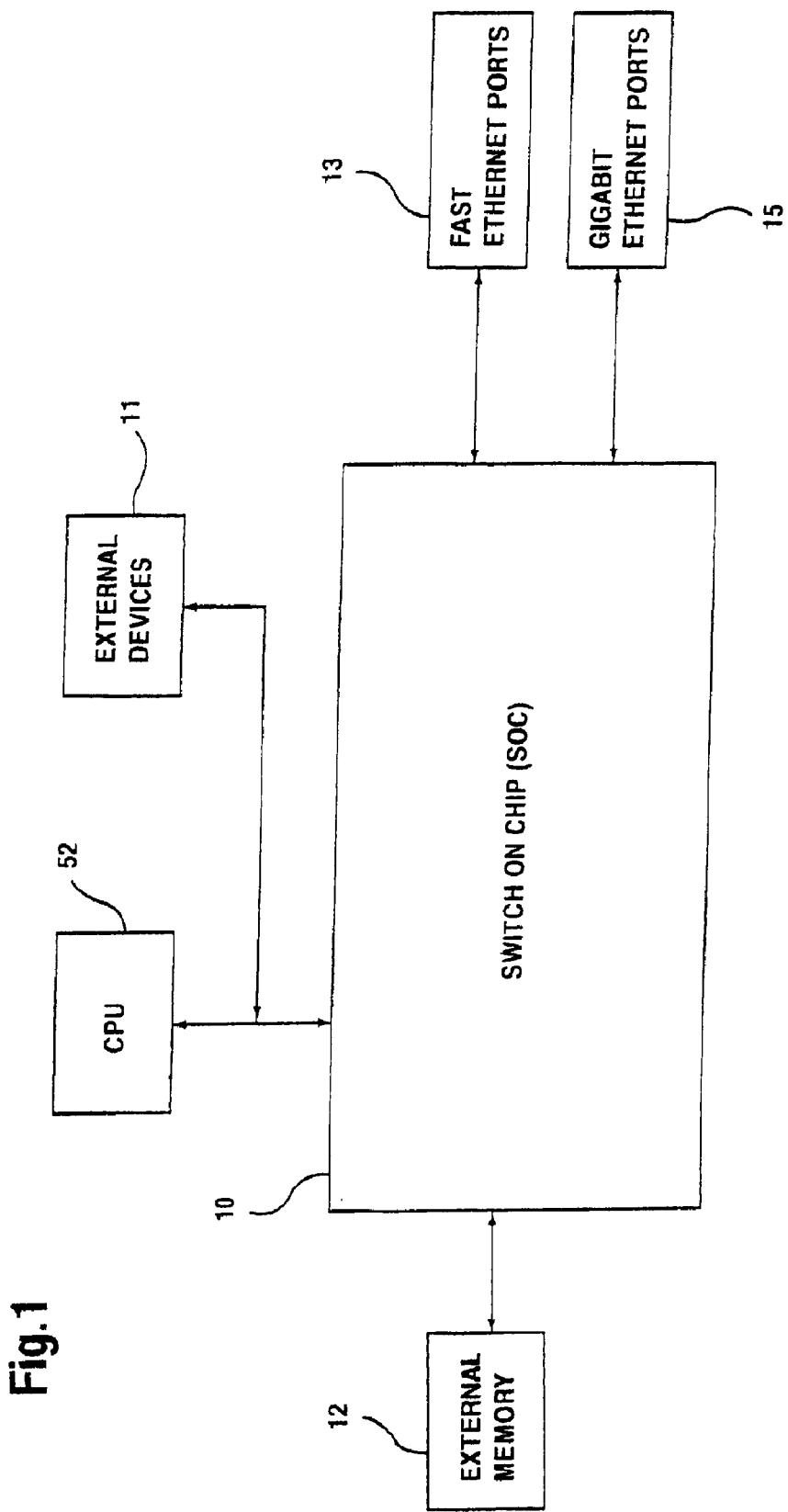
FIG. 1 is a general block diagram of an exemplary network device according to the invention.

FIG. 1 is a basic block diagram of an exemplary high-speed network device to which the present invention is applicable. An exemplary configuration of a network switch is shown. A switch-on-chip (SOC) 10 is functionally connected to external devices 11, external memory 12, fast ethernet ports 13, and gigabit ethernet ports 15. For the purposes of this discussion, fast ethernet ports 13 will be considered low speed ethernet ports, since they are capable of operating at speeds ranging from 10 Mbps to 100 Mbps in this example, while the gigabit ethernet ports 15 or link ports, which are high speed ethernet ports, are capable of operating at 2500 Mbps or higher in this example. External devices 11 could include other switching devices for expanding switching capabilities, or other devices as may be required by a particular application. External memory 12 can be additional off-chip memory, which is in addition to internal memory (on-chip) which is located on SOC 10, which will be discussed below. CPU 52 can be used as desired to program SOC 10 with rules which are appropriate to control packet processing. However, once SOC 10 is appropriately programmed or configured, SOC 10 operates, as much as possible, in a free running manner without communicating with CPU 52. CPU 52 does not control every aspect of the operation of SOC 10, because CPU 52 performance requirements in this example, at least with respect to SOC 10, are fairly low. A less powerful and therefore less expensive CPU 52 can therefore be used when compared to known network switches. As also will be discussed below, SOC 10 utilizes external memory 12 in an efficient manner so that the cost and performance requirements of memory 12 can be reduced. Internal memory on SOC 10, as will be discussed below, is also configured to maximize switching throughput and minimize costs.

It should be noted that port speeds described are merely exemplary and ports may be configured to handle a variety of speeds faster and slower than the speeds discussed herein.

Figure 2:
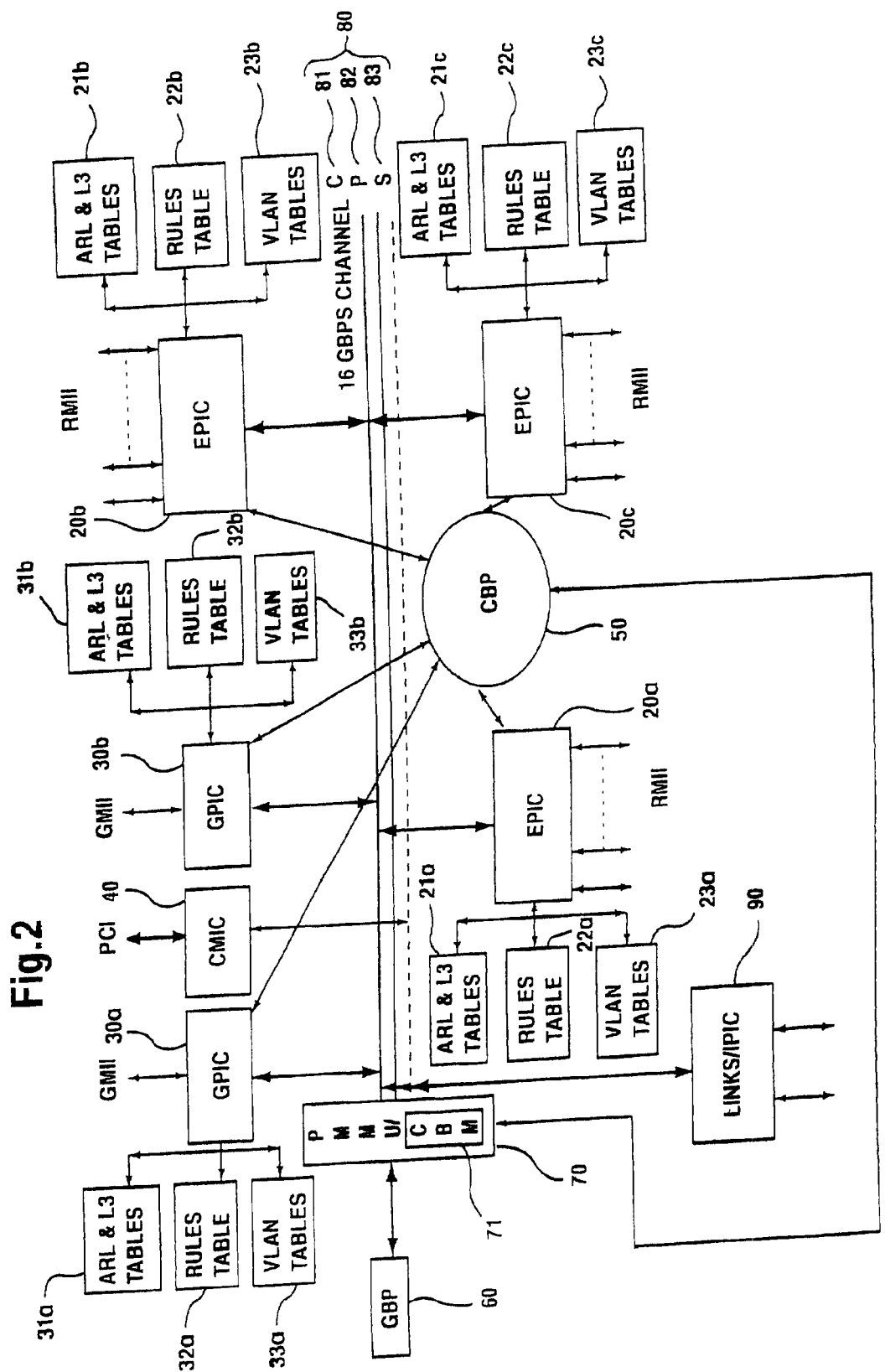
FIG. 2 is a detailed block diagram of a network switch according to the invention.

FIG. 2 illustrates a more detailed block diagram of the functional elements of SOC 10. As evident from FIG. 2 and as noted above, SOC 10 includes a plurality of modular systems on-chip, with each modular system, although being on the same chip, being functionally separate from other modular systems. Therefore, each module can efficiently operate in parallel with other modules, and this configuration enables a significant amount of freedom in updating and re-engineering SOC 10. However, other switch configurations or network device configurations may be utilized to produce the present invention.

SOC 10 may include a plurality of Ethernet Port Interface Controllers (EPIC) 20a, 20b, 20c, etc., a plurality of Gigabit Port Interface Controllers (GPIC) 30a, 30b, etc., a CPU Management Interface Controller (CMIC) 40, a Common Buffer Memory Pool (CBP) 50, a Pipelined Memory Management Unit (PMMU) 70, including a Common Buffer Manager (CBM) 71, and a system-wide bus structure referred to as CPS channel 80. The PMMU 70 includes memory management means and communicates with external memory 12, which includes a Global Buffer Memory Pool (GBP) 60. The CPS channel 80 comprises C channel 81, P channel 82, and S channel 83. The CPS channel is also referred to as the cell protocol sideband channel, and is a 17 Gbps channel which glues or interconnects the various modules together. As also illustrated in FIG. 2, other high speed interconnects can be provided, as shown as an extendible high speed interconnect. In one configuration, this interconnect can be in the form of an interconnect port interface controller (IPIC) 90, which is capable of interfacing CPS channel 80 to external devices 11 through an extendible high speed interconnect link. As will be discussed below, each EPIC 20a, 20b, and 20c, generally referred to as EPIC 20, and GPIC 30a and 30b, generally referred to as GPIC 30, are closely interrelated with appropriate address resolution logic and layer three switching tables 21a, 21b, 21c, 31a, 31b, rules tables 22a, 22b, 22c, 31a, 31b, and VLAN tables 23a, 23b, 23c, 31a, 31b. These tables will be generally referred to as 21, 31, 22, 32, 23, 33, respectively.

EPIC 20 may support a number of fast ethernet ports 13 (8 are shown as an example), and switches packets to and/or from these ports as may be appropriate. The ports, therefore, are connected to the network medium (coaxial, twisted pair, fiber, etc.) using known media connection technology, and communicates with the CPS channel 80 on the other side thereof. The interface of each EPIC 20 to the network medium can be provided through a Reduced Media Internal Interface (RMII), which enables the direct medium connection to SOC 10. As is known in the art, auto-negotiation is an aspect of network communications, wherein the network is capable of negotiating a highest communication speed between a source and a destination based on the capabilities of the respective devices. The communication speed can vary, as noted previously, for example, between 10 Mbps and 100 Mbps, as an example. Auto-negotiation capability, therefore, is built directly into each EPIC 20 or GPIC 30 module. The address resolution logic (ARL) and layer three tables (ARL/L3) 21a, 21b, 21c, rules table 22a, 22b, 22c, and VLAN tables 23a, 23b, and 23c are configured to be part of, or interface with the associated EPIC in an efficient and expedient manner, in order to support wirespeed packet flow. The on-chip memory which is searched in accordance with the present invention may comprise these tables, as is described below in more detail.

Each EPIC 20 and GPIC 30 has separate ingress and egress functions. On the ingress side, self-initiated and CPU-initiated learning of level 2 address information can occur. Address resolution logic (ARL) is utilized to assist in this task. Address aging is built in as a feature, in order to eliminate the storage of address information which is no longer valid or useful. The EPIC and GPIC can also carry out layer 2 mirroring. A fast filtering processor (FFP) 141 may be incorporated into the EPIC, in order to accelerate packet forwarding and enhance packet flow. The EPIC and GPIC may include data transmitters and data receivers for transmitting and receiving data in accordance with the present invention.

The ingress side of each EPIC and GPIC has a significant amount of complexity to be able to properly process a significant number of different types of packets which may come in to the port, for linespeed buffering and then appropriate transfer to the egress. Functionally, each port on each module of SOC 10 can have a separate ingress submodule 14 associated therewith. From an implementation perspective, however, in order to minimize the amount of hardware implemented on the single-chip SOC 10, common hardware elements in the silicon can be used to implement a plurality of ingress submodules on each particular module. The configuration of SOC 10 discussed herein enables concurrent lookups and filtering. Layer two lookups, Layer three lookups and filtering occur simultaneously to achieve a high level of performance, which are described in better detail below. On the egress side, the EPIC and GPIC are capable of supporting packet polling based either as an egress management or class of service (COS) function. Rerouting/scheduling of packets to be transmitted can occur, as well as head-of-line (HOL) blocking notification, discussed later herein, packet aging, cell reassembly, and other functions associated with ethernet port interface.

Each GPIC 30 is similar to each EPIC 20, but in this embodiment, supports only one 2.5 gigabit ethernet port, and utilizes a port-specific ARL table, rather than utilizing an ARL table which is shared with any other ports. Additionally, instead of an RMII, each GPIC port interfaces to the network medium utilizing a gigabit media independent interface (GMII).

A CMIC 40 can act as a gateway between the SOC 10 and the host CPU. The communication can be, for example, along a PCI bus, or other acceptable communications bus. CMIC 40 can provide sequential direct mapped accesses between the host CPU 52 and the SOC 10. CPU 52, through the CMIC 40, will be able to access numerous resources on SOC 10, including MIB counters, programmable registers, status and control registers, configuration registers, ARL tables, port-based VLAN tables, IEEE 802.1q VLAN tables, layer three tables, rules tables, CBP address and data memory, as well as GBP address and data memory. Optionally, the CMIC 40 can include DMA support, DMA chaining and scatter-gather, as well as master and target PCI64.

The configuration of the SOC 10 can support fast Ethernet ports, gigabit ports, and extendible interconnect links as discussed above. The SOC configuration can also be "stacked" or "linked", thereby enabling significant port expansion capability. Once data packets have been received by SOC 10, sliced into cells, and placed on CPS channel 80, stacked SOC modules can interface with the CPS channel and monitor the channel, and extract appropriate information as necessary. As will be discussed below, a significant amount of concurrent lookups and filtering occurs as the packet comes in to ingress submodule 14 of an EPIC 20 or GPIC 30, with respect to layer two and layer three lookups, and fast filtering.

Figure 3:
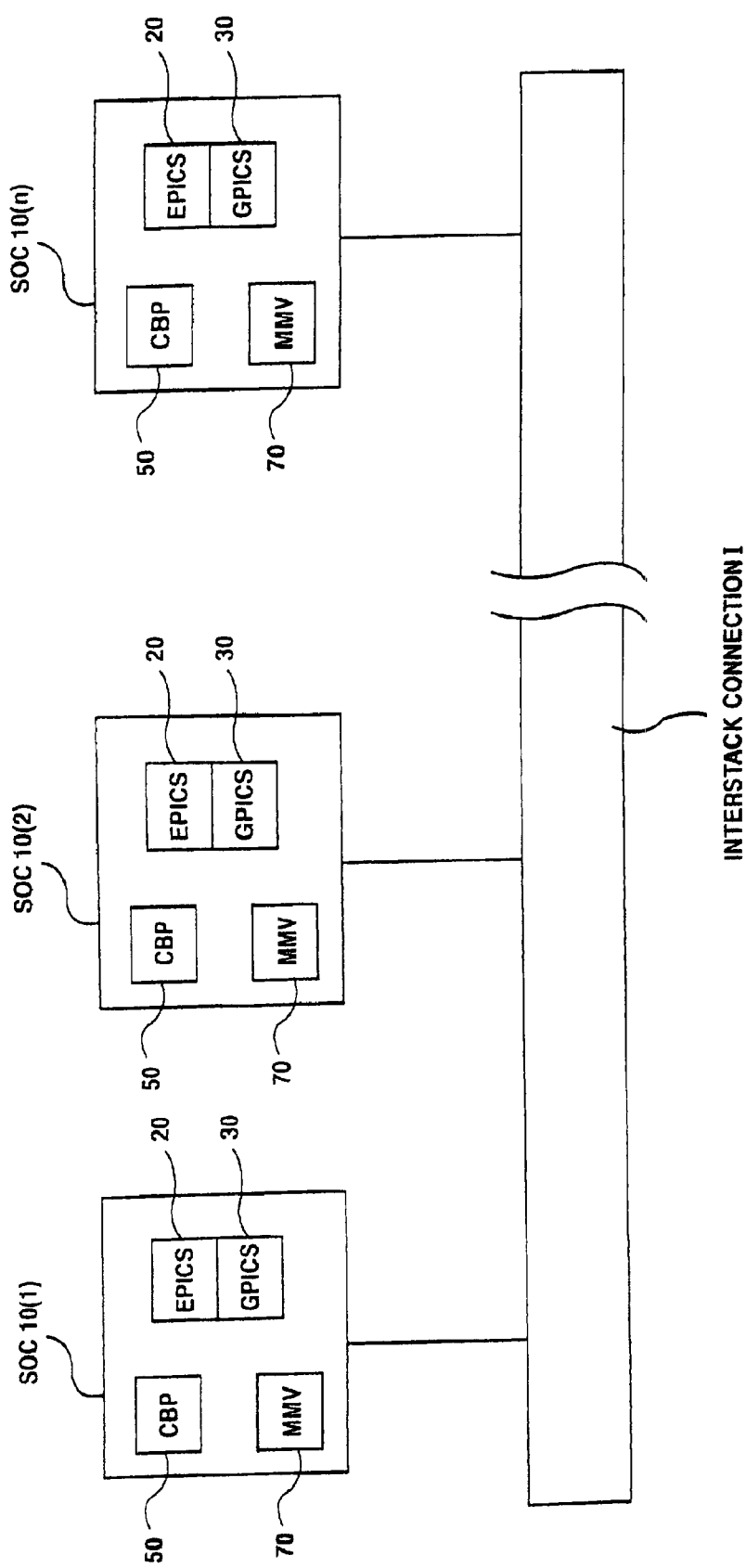
FIG. 3 illustrates an exemplary configuration of linked network devices according to an embodiment of the present invention.

FIG. 3 illustrates an exemplary configuration where a plurality of SOCs 10(1) . . . 10(n) are connected by link ports (not shown). SOCs 10(1)–10(n) include the elements which are illustrated in FIG. 2. FIG. 3 schematically illustrates CVP 50, MMU 70, EPICs 20 and GPICs 30 of each SOC 10.

Interstack connection I is used to provide a stacking configuration between the switches, and can utilize, as an example, at least one gigabit uplink or other ports of each switch to provide a simplex or duplex stacking configuration as will be discussed below.

Figure 4:
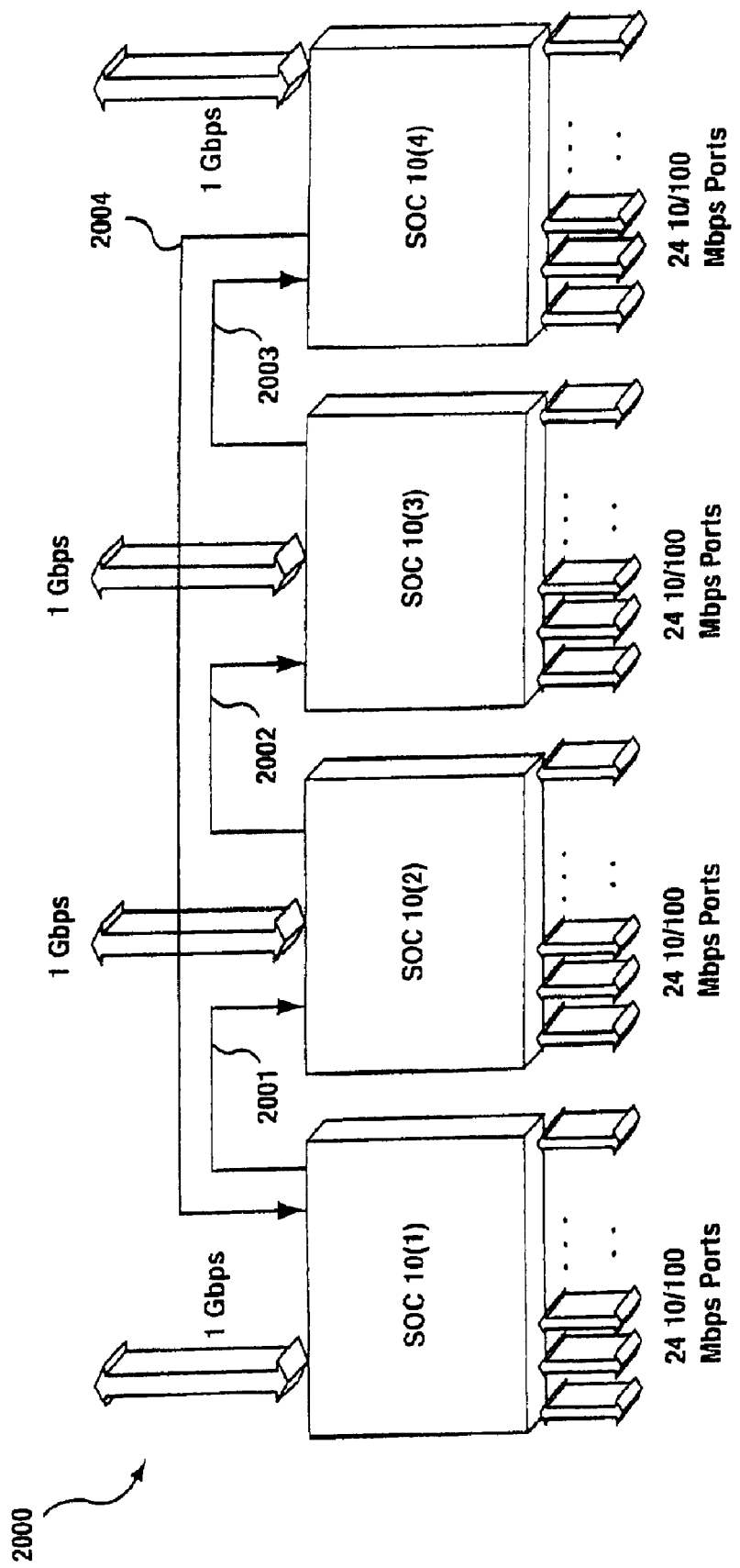
FIG. 4 illustrates another exemplary configuration of linked network devices according to an embodiment of the present invention.

FIG. 4 illustrates a configuration wherein a plurality of SOCs 10(1)–10(4) are connected in a configuration using GPIC modules 30 to create a stack. Using an example where each SOC 10 contains 24 low speed Ethernet ports having a maximum speed of 100 Megabits per second, and two 2.5 gigabit ports. The configuration of FIG. 4, therefore, could result in 96 Ethernet ports and 4 usable 2.5 gigabit ports, with four other 2.5 gigabit ports being used to link the stack as what is called a stacked link. Interconnection as shown in FIG. 4 results in what is referred to as a simplex ring, enabling unidirectional communication at a rate of 1–2.5 gigabits per second. All of the ports of the stack may be on the same VLAN, or a plurality of VLANs may be present on the stack. Multiple VLANs can be present on the same switch. The VLAN configurations are determined by the user, depending upon network requirements. This is true for all SOC 10 switch configurations. It should be noted, however, that these particular configurations used as examples only, and are not intended to limit the scope of the claimed invention.

Figure 5:
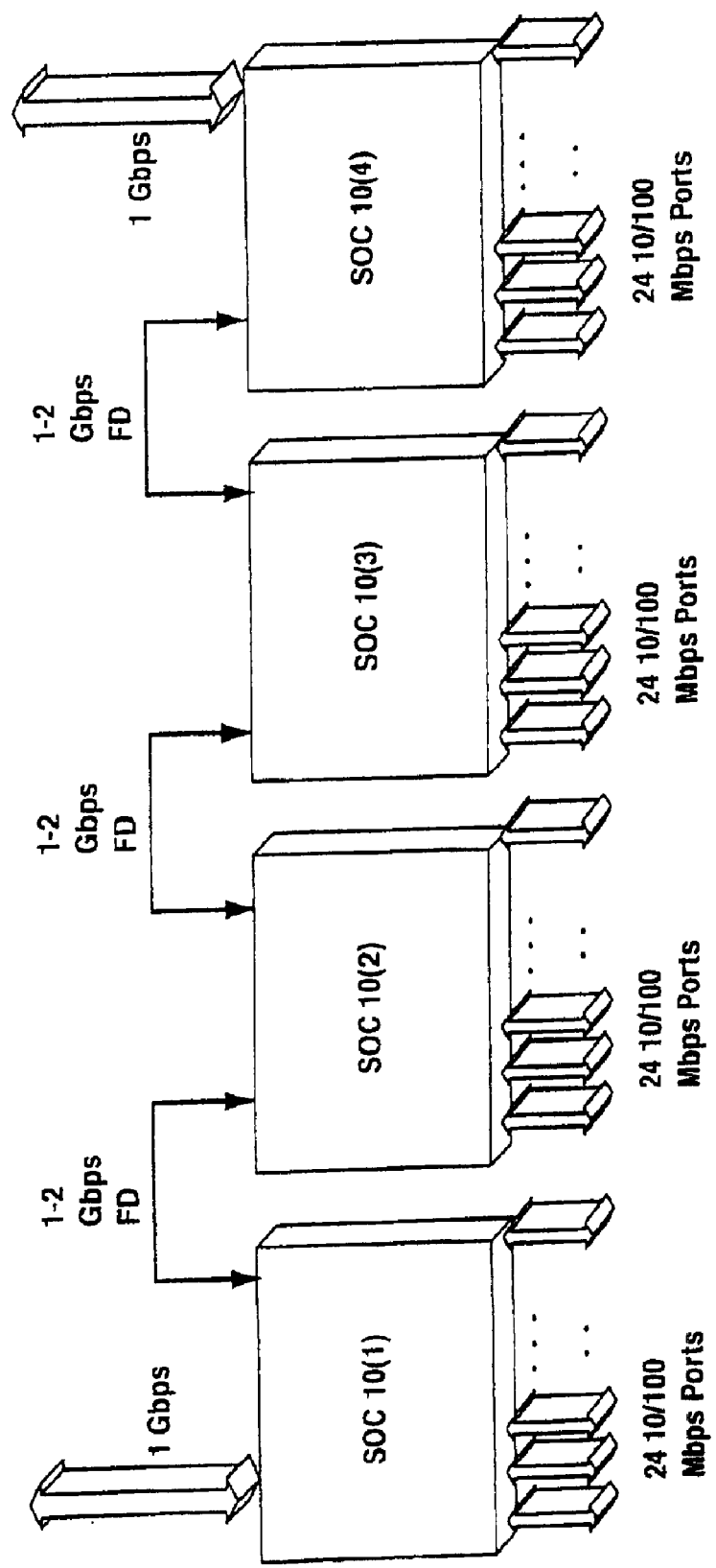
FIG. 5 illustrates another exemplary configuration of linked network devices according to an embodiment of the present invention.

FIG. 5 illustrates a second configuration of four stacked SOC 10 switches, SOC 10(1) . . . 10(4). However, any number of switches could be stacked in this manner. The configuration of FIG. 5 utilizes bi-directional interstack links to create a full duplex configuration. The utilization of bi-directional interstack links, therefore, eliminates the availability of a gigabit uplink for each SOC 10 unless additional GPIC modules are provided in the switch. The only available gigabit uplinks for the stack, therefore, are one gigabit port at each of the end modules. In this example, therefore, 96 low speed Ethernet ports and 2 highspeed Ethernet ports are provided.

Figure 6:
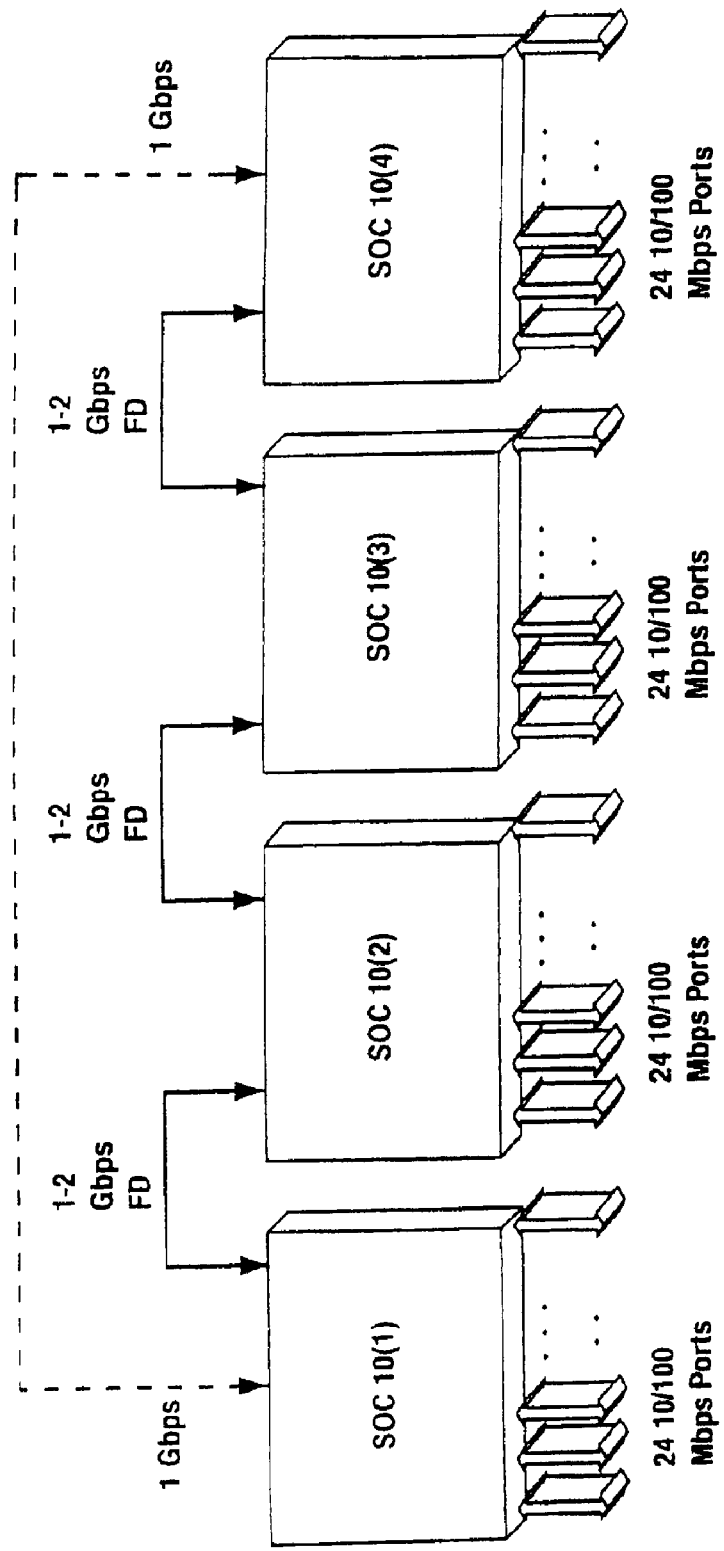
FIG. 6 illustrates another exemplary configuration of linked network devices according to an embodiment of the present invention.

FIG. 6 illustrates a third configuration for stacking four SOC 10 switches. In this configuration, the interconnection is similar to the configuration of FIG. 4, except that the two gigabit ports at the end modules are connected as a passive link, thereby providing redundancy. A passive link in this configuration is referred to in this manner since the spanning tree protocol discussed previously is capable of putting this link in a blocking mode, thereby preventing looping of packets. A trade-off in this blocking mode, however, is that no gigabit uplinks or link ports are available unless an additional GPIC module 30 is installed in each SOC 10. Accordingly, non-blocking linking solutions are preferred.

The following are descriptions of systems and methods of transferring data from one network device to another at double the data rate (DDR) according to the present invention. Such systems and methods may be applied to the above-described switching configurations, particularly with the linking solutions described. One having ordinary skill in the art will readily understand the present invention after reviewing the following discussion with reference to the drawing figures in view of the discussions above. In following discussions, like functions and devices are referenced with the numerals.

In order to provide non-blocking linked switching solutions, the data speed of the interstack link is desired to be 2.5 Gps or faster. Therefore, in order to design a solution that utilizes standard PCB data speeds, double data rate (DDR) is used.

Figure 7:
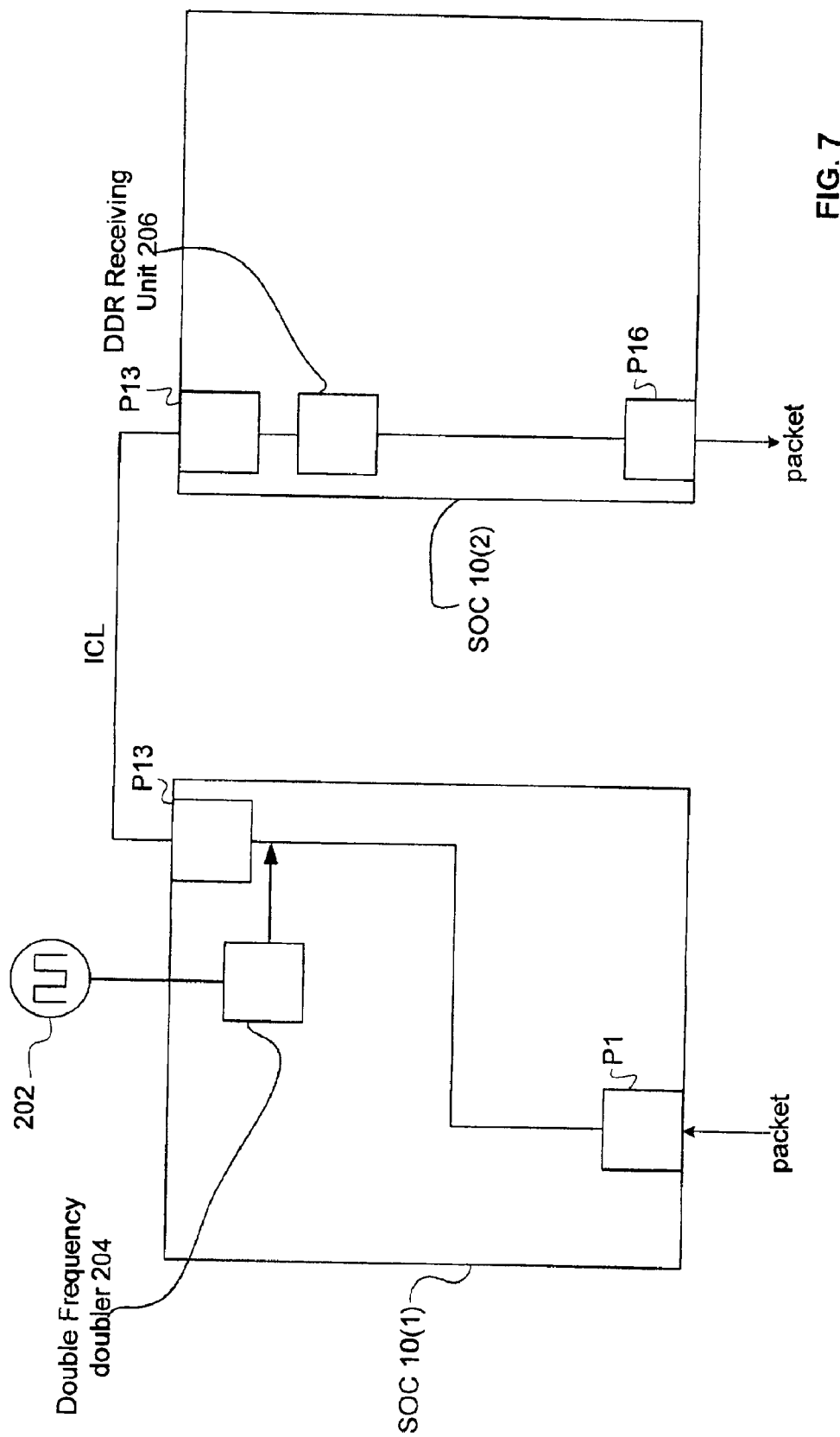
FIG. 7 is a block diagram of linked network devices according to an embodiment of the present invention.

FIG. 7 is a block diagram of two SOC 10's linked together by a link port. In particular, an external clock 202 (duty clock) provides an external clock signal to SOC 10(1) via an input, which is used by the I/O transmitter of each SOC 10 (only shown on SOC 10). The clock signal is input to a frequency doubler 204 which is configured to doubles the frequency of the an input signal and output a signal having the doubled frequency. Accordingly, the frequency doubler 204 outputs a clock cycle having twice the frequency of the external clock signal. When a data packet is received at a port P1 to be routed to SOC 10(2), the packet is internally switched to the link port P13 via internal logic, such as described above with reference to FIGS. 1 and 2. SOC 10(1) includes I/O transmitters and receivers (not shown) or other data I/O devices to output or receive data at its ports. For example, the egress of each port may include rising edge registers which will output data at the rising edge of a reference clock. In this example, the external clock signal after being doubled is applied to the I/O transmitter of SOC 10(1) and the data is transferred at double the speed of the external clock between linking ports P13 and P14 across the ICL. The data received at P14 is received into a DDR receiving circuit 206 which is configured to receive data and an accompanying clock signal, and extract the data at double data rate as compared to the accompanying clock signal. For example, the DDR receiving circuit 206 may be configured to extract data at both the rising and falling edges of the accompanying clock signal. Accordingly, a clock signal is transmitted with the data packet between ports P13 and P14 (e.g., not shown). Once the packet is received via the DDR receiving unit, SOC 10(2) handles the packet in accordance with the switching operations to route the packet to a network port, such as port 14, and transmit the packet to another network device.

Figure 8:
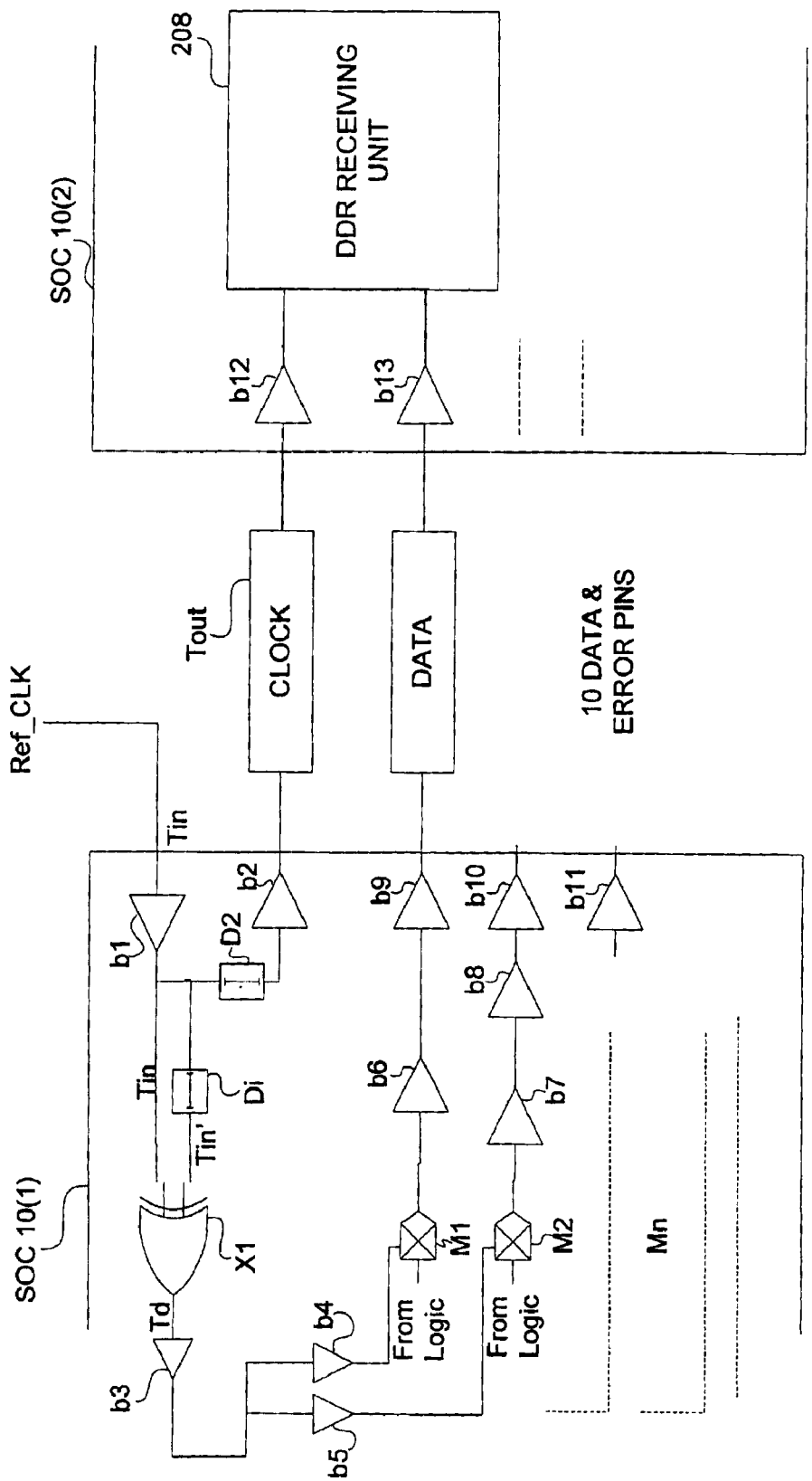
FIG. 8 is a schematic diagram of a link configuration according to an embodiment of the present invention.

Referring now to FIG. 8, a detailed diagram of two switches interfaced together via a high-speed link port is shown according to the present invention. In particular, SOC 10(1) receives a clock signal ref_clk from an external clock, such as a square wave. The clock signal is initially buffered by buffer b1 and the clock is split into two signals. A first signal Tin is fed directly into an exclusive OR gate X1. The second signal is fed to a delay element d1 and is delayed by half a cycle. The delayed signal Tin' is also fed into the exclusive OR gate X1.

Figure 10:
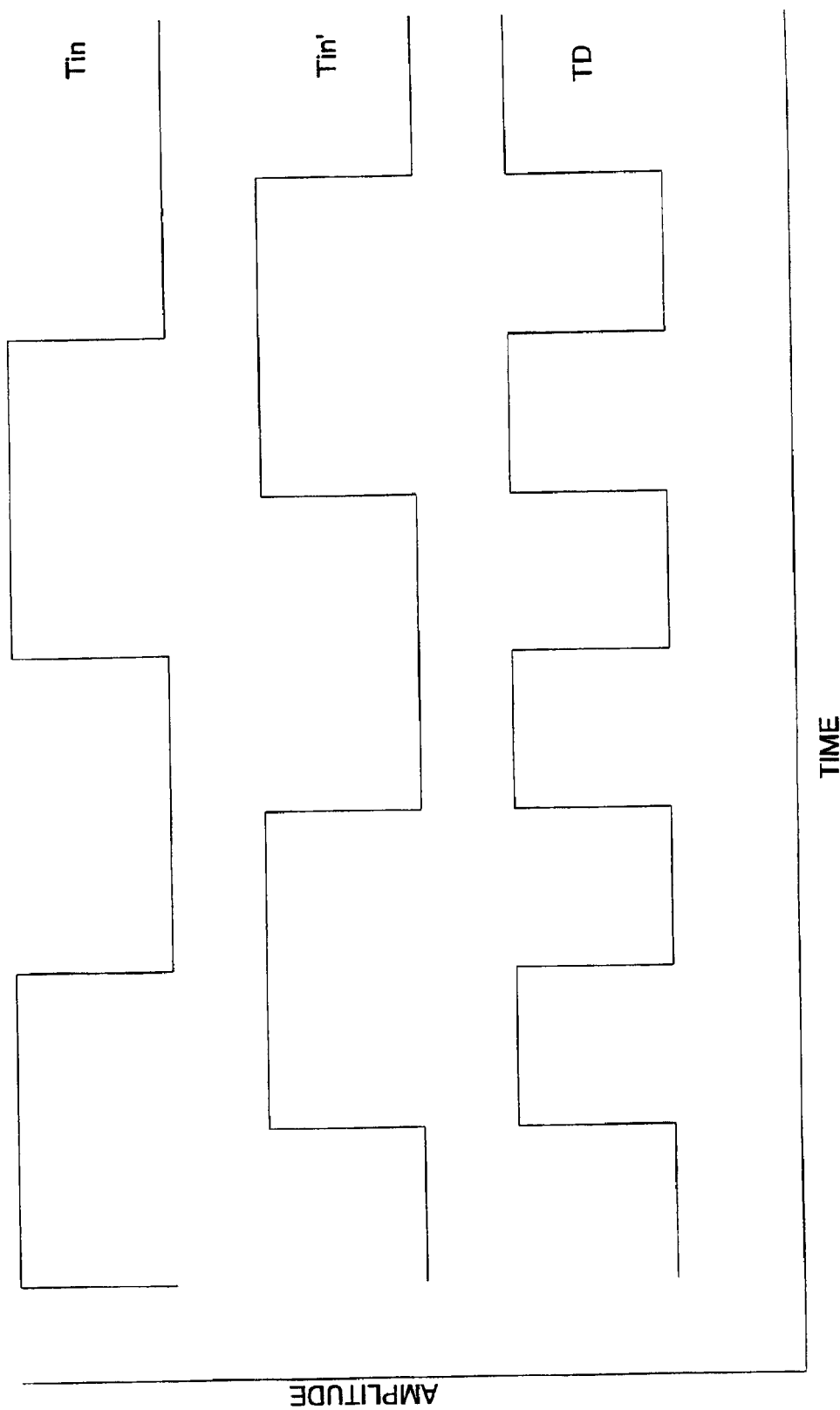
FIG. 10 is a graph of input clock signals and a doubled clock signal according to the present invention.

To better demonstrate the frequency doubler of FIG. 8, reference is made to FIG. 10. Two input signals into the exclusive OR gate X1 and the output signal of the exclusive OR gate X1 are shown. Tin is a square wave clock signal having a cycle length of f. Tin' is the same clock signal delayed by half a cycle and therefore also has a cycle length of f but is 90° out if phase with Tin. The output of the exclusive OR gate X1 is shown as having a cycle length of ½ f or is double the frequency of Tin.

One having ordinary skill in the art will readily understand the operations of the exclusive OR gate X1 which produces a 1 or a 0 based on the input signals. An output of 1 is produced from an input of 0 and 0, or 1 and 1. An output of 0 is produced from an input of 1 and 0, or 0 and 1. Accordingly, shown is an exemplary frequency doubler. One having ordinary skill in the art would readily understand that a number of frequency doublers may be used in the present invention.

Referring back to FIG. 8, clock signal Tin is also split a third time and is input into a delay element D2 into a buffer b2, and output out of the switch SOC 10(1). The clock signal is output in parallel with the data output of the switch so that a receiving switch may have a reference clock signal to use when receiving the data.

The clock signal Td as doubled by the frequency doubler is fed into a buffer b3 and then split a number of times for the number of channels or pins used to transmit data. As an example, 10 data and error pins may be used (8 data pins and 2 error or reserve pins). Accordingly, each doubled clock signal Td is then input into an I/O device used to output data. In this example, rising edge registers m1, m2 . . . mn, are used to drive the data received from other switching logic, at the rising edge of the input clock signal Td. Each data signal is fed through a series of delay elements B6–B11, preferably programmable, before being output from switch SOC 10(1). These programmable delay elements make up a variable delay circuit that may be varied, such as during testing or configuration of the switch, to align each data signal with the clock signal in order to eliminate skew.

Skew may be caused by wiring differences, such as different length paths, between each data pin. These wiring differences may delay the clock signal a different amount between data pins. In a preferred embodiment of the present invention, the IO driver and the receiver are SSTL type. Accordingly, SSTL-2 buffers are used to reduce noise.

SOC 10(2) receives the data and the clock signals, buffers them both in buffers b12 and b13, and then inputs the signals into a DDR 208 receiver or gate array. Accordingly, data is received on both the rising edge and the falling edge of the clock signal Tout which has a frequency of ½ of the clock signal Td that is used to drive the data. However, the data driver only drives the data on the rising edge of the clock, and therefore, the DDR receiving unit 208 receives data synchronized with the data driven by switch SOC 10(1).

According to a preferred embodiment of the present invention, 10 one-way pins (not shown) are used to drive data from one switch SOC 10(1) to another switch SOC 10(2). Accordingly, in this embodiment, switch SOC 10(1) and switch SOC 10(2) are connected by 20 data pins via a circuit (not shown). As a result, a data rate of 2.5 Gbps may be obtained between switching with an external clock speed of 156 MMz.

According to an embodiment of the present invention, the basic chip design may be computer generated for each chip and is referred to as an application specific IC design (ASIC). ASIC designs are used to shorten design cycles and improve manufacturing, and therefore are preferred. A software tool may be used to predict signal delays for each data pin based on the ASIC design For example, the BROADCOM CORP. developed a library which may be used to accurately predict the delay based on varying wiring lengths within a chip. Using the library, it can be determined how to calibrate the variable delay circuit by selecting the value for each delay elements (i.e., by changing the design or by programming the delay elements which might be programmable) in order to reduce skew between individual data circuits and to synchronize the data signals with the each other and the output clock signal Tout.

Figure 9:
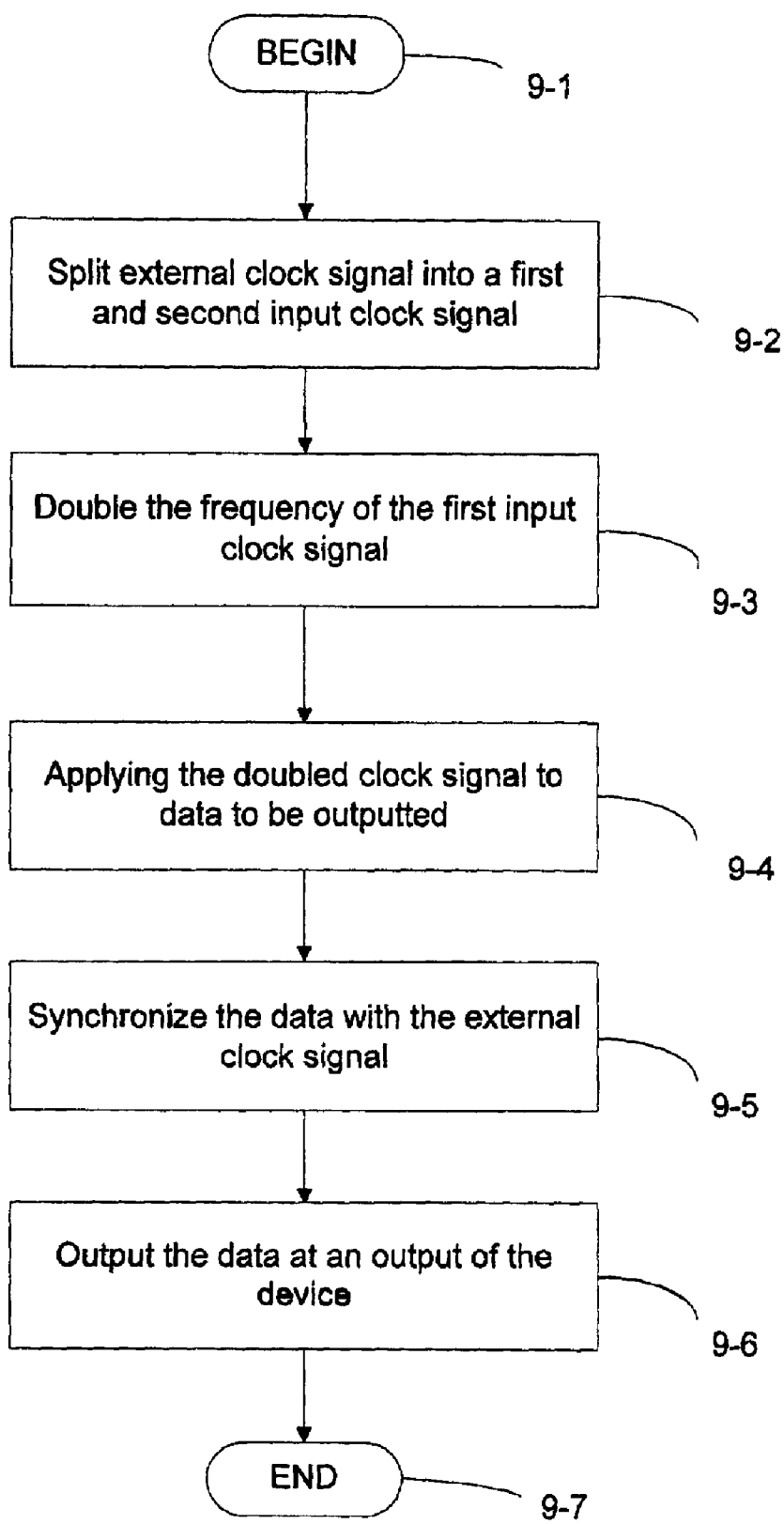
FIG. 9 is a flow chart of a method for linking network devices according to an embodiment of the present invention.

Referring to FIG. 9, shown is a flow chart of a method for linking network devices according to the present invention. Processing begins at step S9-1 and proceeds to step S9-2 immediately. At step S9-2, an external clock signal is split internally into a first and second clock signal. For example, as described above, a network device (e.g., SOC 10) may receive an external clock signal from a clock on a PCB via an input. A circuit may be provided to split the clock signal into two clock signals.

Next at step S9-3, one of the signals is doubled in frequency. As described above, various methods may be utilized to double the frequency of the signal. For example, the clock signal may be split again, and one of the clock signals can be delayed 90° out of phase with the other. Then, the two signals can be input into an exclusive OR gate which will output a clock signal having twice the frequency of the input signals.

Next at step S9-4, the doubled clock signal is applied to data to be output of the device. For example, in a switch, a data packet being transferred across the interstack link between linked switched is output to the port by an I/O device. The doubled clock signal may be used as a reference clock by the I/O device. As described above, the doubled clock signal Td is input to rising edge registers, which drive the data on the rising edge of the square wave.

Next at step S9-5, the date is synchronized with the external clock. For example, as described above with reference to FIGS. 7 and 8, a circuit may provide the second input clock signal (external clock) to the output of the device, such as the link port, to be output as a reference clock signal to the data. Also, the data may be divided into portions and transmitted via a number of pins in parallel. Therefore, each data portion in parallel should be synchronized (centered on the rising and falling edges) with the reference clock and with each other to prevent skew. A variable delay circuit may be provided, for example, between the I/O device and that data pins, to individually delay each signal. The delay for each signal can be varied to synchronize the data and the clock. The variable delay circuit may include programmable delay elements that can be varied during the initial configuration of the device, or alternatively, the delay elements may be set during the design process.

Next, at step S9-6, the data and the clock are output of the device. As described above, a link port may be used to output the data and the clock, and therefore, a circuit may be provided between the pins of the device and of a device receiving the data. As described above, the device receiving the data should include a DDR receiving unit, which is configured to sample the data at the rising and the falling edge of the reference clock.

Processing terminates at step S9-7.

Although the invention has been described based upon these preferred embodiments, it would be apparent to those of skilled in the art that certain modifications, variations, and alternative constructions would be apparent, while remaining within the spirit and scope of the invention. For example, any network device may benefit from the described systems and methods for transmitting data between device. Also, other switch configurations could be used to take advantage of the invention. In order to determine the metes and bounds of the invention, therefore, reference should be made to the appended claims.

What is claimed is:

1. A network device comprising:
   an input for receiving an external clock signal;
   at least one port;
   a frequency doubler coupled to said input and configured to receive an input signal and output an output signal with a frequency that is double that of the input signal;
   a data I/O device configured to output data to said at least one port based on a reference clock signal; and
   a variable delay circuit between said data I/O device and said at least one port;
   wherein said external clock signal received at said input is input into said frequency doubler, the output signal of said frequency doubler being applied to the data I/O device as the reference clock signal, said output data being delayed by said variable delay circuit.

2. The network device of claim 1, wherein said frequency doubler comprises a circuit for splitting said external clock signal into a first and second clock signal, a delay element for delaying at least one of said first and second clock signal, and an element for integrating said first and second clock signal into said output signal.

3. The network device of claim 2, wherein said element for integrating said first and second clock signals comprises an exclusive OR gate downstream of said delay element.

4. The network device of claim 1, further comprising a switch interrelationship, wherein said at least one port is configured for linking said switch to another network device.

5. The network device of claim 4, wherein said at least one port is configured to transmit and receive data at a speed of 2.5 Gbps.

6. The network device of claim 5, wherein said at least one port comprises a plurality of data pins for outputting said data in a plurality of portions, a speed of said external clock signal is 156 kHz, and said variable delay circuit being applied to said data in order to prevent skew between each of said plurality of portions of said data.

7. The network device of claim 6, further comprising a circuit coupled to the input of said frequency doubler and to said at least one port, wherein said external clock signal is transmitted with said data and said variable delay circuit synchronizes each said data portion of said data with said external clock signal.

8. The network device of claim 1, wherein said variable delay circuit comprises a plurality of programmable delay elements.

9. The network device of claim 1, wherein said I/O device comprises a rising edge register.

10. The network device of claim 6, wherein said I/O device comprises a plurality of rising edge registers corresponding to said plurality of pins.

11. A network device comprising:
a input means for receiving an external clock signal;
at least one port;
a frequency doubler means coupled to said input means for receiving an input signal and outputting an output signal having a frequency that is double that of the input signal;
a data I/O means for outputting data to said at least one port based on a reference clock signal; and
a variable delay circuit means;
wherein said external clock signal received at said input means is input into said frequency doubler means, the output signal of said frequency doubler means being applied to the data I/O device as the reference clock signal, said output data being delayed by said variable delay circuit means.

12. The network device of claim 11, wherein said frequency doubler means comprises a circuit means for splitting said external clock signal into a first and second clock signal, a delay element means for delaying at least one of said first and second clock signal, and an integrator means for integrating said first and second clock signal into said output signal.

13. The network device of claim 12, wherein said integrator means comprises an exclusive OR gate downstream of said delay element means.

14. The network device of claim 11, further comprising a switch means, wherein said at least one port is configured for linking said switch means to another network device to transfer data between said switch means and said another network device at double data rate.

15. The network device of claim 14, wherein said at least one port is configured to transmit and receive data at a speed of 2.5 Gbps.

16. The network device of claim 15, wherein said at least one port comprises a plurality of data pin means for outputting said data in a plurality of portions, a speed of said external clock signal is 156 kHz, and said variable delay circuit means being applied to said data in order to prevent skew between each of said plurality of portions of said data.

17. The network device of claim 16, further comprising a circuit means for providing said external clock signal to said at least one port, said external clock signal being transmitted with said data, and said variable delay circuit means being configured to delay said data in order to prevent skew between each of said plurality of portions of said data.

18. The network device of claim 11, wherein said variable delay circuit means comprises a plurality of programmable delay elements means.

19. The network device of claim 11, wherein said data I/O means comprises a rising edge register.

20. The network device of claim 16, wherein said data I/O means comprises a plurality of rising edge registers corresponding to each of said plurality of pin means.

21. A method for linking network devices comprising the steps of:
receiving an external clock signal at a first device;
splitting said external clock signal received by said first device into a first input clock signal and a second input clock signal within said first device;
doubling the frequency of said first input clock signal;
applying said doubled clock signal to data to be outputted of said first device at double the data rate of said external clock signal, said data being outputted at a port of said first device;
delaying said data to be outputted; and
providing said second input clock signal to said port of said first device;
wherein said data is variably delayed to synchronize said data with said second input clock signal, and said data and said second input clock signal are transmitted out of said first device at said port.

22. The method of step 21, further comprising the steps of:
providing a DDR receiving unit in a second device configured to receive a data signal and a clock signal from an input of said second device and output data into a data communications channel of said second device; and
providing a means for communicating said output of said first device to said input of said second device.

23. The method of step 21, said port of said device comprises a plurality of data pins for transmitting data, further comprising the step of:
partitioning data to be outputted into portions corresponding to each of said plurality of data pins;
wherein said each portion of said data is delayed variably to synchronize each said portion of said data with said second input clock signal.

24. A network device comprising:
a first switch comprising
an input,
a first plurality of ports,
a frequency doubler coupled to said input and configured to receive an input signal and output an output signal with a frequency double that of the input signal,
an I/O device configured to output data to at least one of said plurality of ports based on a first reference clock signal, and a variable delay circuit;
said network device further comprising a second switch comprising
a second plurality of ports and
a double data rate receiving unit configured to receive data and a second reference clock signal from at least one of said second plurality of ports, and to extract data based on a rising edge and a falling edge of said second reference clock signal;
an external clock coupled to said first switch; and
a circuit coupling a first link port of said first plurality of ports to a second link port of said second plurality of ports;
wherein an external clock signal received as said input of said first switch from said external clock is input into said frequency doubler, said output of said frequency doubler being input to said I/O device as a first reference clock signal, said I/O device outputting said data to said first link port via said variable delay circuit, said variable delay circuit delaying said data, said switch being configured to output said data and said external clock signal from said link port to said second link port of said second switch via said circuit, said second switch being configured to receive said data and said external clock signal and input said external clock signal as a second reference clock and said data to said double data rate receiving unit, said double data rate receiving unit extracting said data at double data rate.

25. The network device of claim 24, wherein said frequency doubler comprises a circuit for splitting said external clock signal into a first and second clock signal, a delay element for delaying at least one of said first and second clock signal, and an element for integrating said first and second clock signal into said doubled clock signal.

26. The network device of claim 25, wherein said element for integrating said first and second clock signals comprises an exclusive OR gate downstream of said delay element.

27. The network device of claim 24, wherein said first and second link ports are configured to transmit and receive data at a speed of 2.5 Gbps.

28. The network device of claim 27, wherein said first and second link port each comprise a plurality of data pins for inputting and outputting said data in a plurality of portions, a speed of said external clock signal is 156 kHz, and said variable delay circuit being configured to delay said data in order to prevent skew between each of said plurality of portions of said data.

29. The network device of claim 24, wherein said variable delay circuit comprises a plurality of programmable delay elements.

30. The network device of claim 24, wherein said I/O device comprises a rising edge register.

31. The network device of claim 28, wherein said I/O device comprises a plurality of rising edge registers corresponding to said plurality of pins.

32. A network device comprising:
a first switch means comprising
an input means,
a first plurality of ports,
a frequency doubler means coupled to said input for receiving an input signal and outputting an output signal with a frequency double that of the input signal,
an I/O device means for outputting data to at least one of said plurality of ports based on a first reference clock signal, and
a variable delay circuit means;
a second switch means comprising
a second plurality of ports and
a double data rate receiving means for receiving data and a second reference clock signal from at least one of said second plurality of ports, and for extracting data based on a rising edge and a falling edge of said second reference clock signal;
an external clock means for generating an external clock signal coupled to said first switch; and
a circuit means for coupling a first link port of said first plurality of ports to a second link port of said second plurality of ports;
wherein said first switch means is configured to receive an external clock signal via said input means from said external clock means and input said external clock signal into said frequency doubler means, to input said output of said frequency doubler means to said I/O device means as a first reference clock signal, to output said data from said I/O device means to said first link port via said variable delay circuit means, said data being delayed by said variable delay circuit means, to output said data and said external clock signal from said link port to said second link port via said circuit means, said second switch being configured to receive said data and said external clock signal and input said external clock signal as a second reference clock, and said data to said double data rate receiving means, said double data rate receiving unit extracting said data at double data rate.

33. The network device of claim 32, wherein said frequency doubler means comprises a circuit means for splitting said external clock signal into a first and second clock signal, a delay means for delaying at least one of said first and second clock signal, and an integrating means for integrating said first and second clock signal into said doubled clock signal.

34. The network device of claim 33, wherein said integrating means comprises an exclusive OR gate downstream of said delay means.

35. The network device of claim 32, wherein said first and second link ports are configured to transmit and receive data at a speed of 2.5 Gbps.

36. The network device of claim 35, wherein said first and second link port each comprise a plurality of data pin means for inputting and outputting said data in a plurality of portions, said external clock means being configured to generate an external clock signal having a speed of 156 kHz, and said variable delay circuit means being configured to delay said data in order to prevent skew between each of said plurality of portions of said data.

37. The network device of claim 32, wherein said variable delay circuit comprises a plurality of programmable delay elements.

38. The network device of claim 32, wherein said I/O device comprises a rising edge register.

39. The network device of claim 36, wherein said I/O device comprises a plurality of rising edge registers corresponding to said plurality of pins.

* * * * *